United States Patent
Pohl et al.

(10) Patent No.: US 10,790,622 B2
(45) Date of Patent: Sep. 29, 2020

(54) DETECTING DECOUPLING OF A FIRST CONNECTOR PART FROM A SECOND CONNECTOR PART OF AN ELECTRICAL PLUG CONNECTOR

(71) Applicant: BECKHOFF AUTOMATION GMBH, Verl (DE)

(72) Inventors: Christopher Pohl, Verl (DE); Thomas Rettig, Rheda-Wiedenbrück (DE); Hans Beckhoff, Verl (DE); Dirk Bechtel, Bielefeld (DE)

(73) Assignee: Beckhoff Automation GmbH, Verl (DE)

( * ) Notice: Subject to any disclaimer, the term of this patent is extended or adjusted under 35 U.S.C. 154(b) by 108 days.

(21) Appl. No.: 15/473,203

(22) Filed: Mar. 29, 2017

(65) Prior Publication Data
US 2017/0288348 A1 Oct. 5, 2017

(30) Foreign Application Priority Data
Mar. 30, 2016 (DE) .......... 10 2016 105 747

(51) Int. Cl.
| | |
|---|---|
| *H01R 13/02* | (2006.01) |
| *H01R 13/703* | (2006.01) |
| *G06F 1/30* | (2006.01) |
| *G01R 31/69* | (2020.01) |
| *H01R 13/66* | (2006.01) |
| *H02H 9/00* | (2006.01) |

(52) U.S. Cl.
CPC ......... *H01R 13/7031* (2013.01); *G01R 31/69* (2020.01); *G06F 1/30* (2013.01); *H01R 13/02* (2013.01); *H01R 13/6683* (2013.01); *H02H 9/004* (2013.01)

(58) Field of Classification Search
CPC ........................ H01R 13/02; H01R 13/7031
USPC ........................................................ 307/130
See application file for complete search history.

(56) References Cited

U.S. PATENT DOCUMENTS

| | | | | |
|---|---|---|---|---|
| 4,034,172 A | * | 7/1977 | Glover | H01R 13/703 200/51.1 |
| 5,722,068 A | * | 2/1998 | Bartle | H04W 76/30 455/421 |
| 5,898,290 A | * | 4/1999 | Beard | G06F 12/1408 307/116 |

(Continued)

FOREIGN PATENT DOCUMENTS

| | | |
|---|---|---|
| DE | 10225259 B3 | 1/2004 |
| DE | 602005001268 T2 | 1/2008 |

(Continued)

OTHER PUBLICATIONS

"Frame (networking)" Wikipedia, downloaded Jun. 13, 2019 from <https://en.wikipedia.org/wiki/Frame_(networking), 2 pages.

*Primary Examiner* — Adi Amrany
(74) *Attorney, Agent, or Firm* — Dorsey & Whitney LLP

(57) ABSTRACT

A technique is provided for detecting decoupling of a first connector part, connected to a first device, of an electrical plug connector from a second connector part, connected to a second device, of the electrical plug connector. A corresponding method, a corresponding apparatus, a corresponding electrical plug connector as well as the first connector part and the second connector part of the plug connector, a corresponding device and a computer program product are stated.

11 Claims, 5 Drawing Sheets

(56) References Cited

U.S. PATENT DOCUMENTS

| | | | | |
|---|---|---|---|---|
| 6,157,830 A | * | 12/2000 | Minde | H04L 1/20 |
| | | | | 455/226.1 |
| 7,021,950 B2 | | 4/2006 | Borrego Bel et al. | |
| 8,441,151 B2 | * | 5/2013 | Huang | H02H 9/004 |
| | | | | 307/97 |
| 2011/0122663 A1 | * | 5/2011 | Huang | H02H 9/004 |
| | | | | 363/50 |
| 2011/0248021 A1 | * | 10/2011 | Gutierrez | F24C 15/16 |
| | | | | 219/620 |
| 2013/0286522 A1 | * | 10/2013 | Mullins | H04M 3/08 |
| | | | | 361/58 |
| 2013/0286523 A1 | * | 10/2013 | Mullins | G06F 1/30 |
| | | | | 361/93.9 |
| 2014/0003223 A1 | * | 1/2014 | Deb | H04L 43/0823 |
| | | | | 370/216 |
| 2014/0177121 A1 | * | 6/2014 | Ueno | H02H 5/04 |
| | | | | 361/104 |
| 2015/0296950 A1 | * | 10/2015 | Everett, Jr. | A45D 1/04 |
| | | | | 219/225 |
| 2016/0109317 A1 | * | 4/2016 | Gilman | B23P 15/26 |
| | | | | 73/714 |
| 2017/0040737 A1 | * | 2/2017 | Kim | H01R 13/514 |

FOREIGN PATENT DOCUMENTS

| | | |
|---|---|---|
| DE | 202012011640 U1 | 3/2013 |
| DE | 102013205786 A1 | 10/2013 |
| EP | 1714371 B1 | 5/2007 |

* cited by examiner

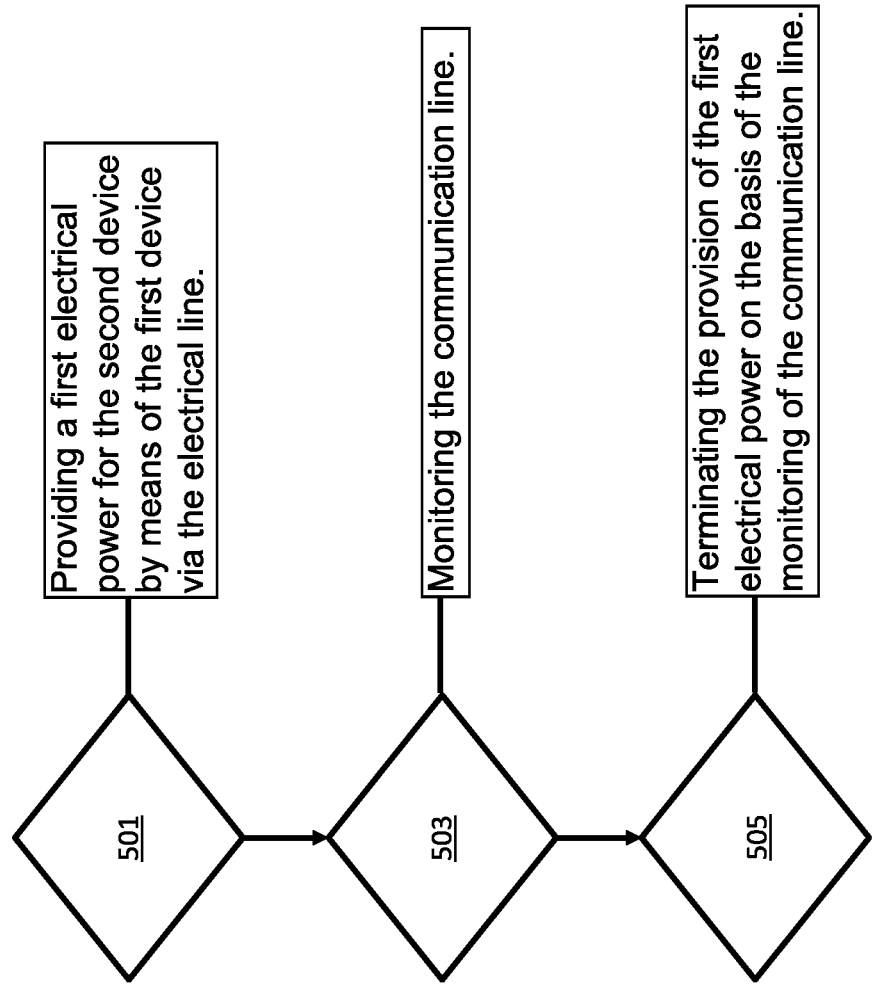

DETECTING DECOUPLING OF A FIRST CONNECTOR PART FROM A SECOND CONNECTOR PART OF AN ELECTRICAL PLUG CONNECTOR

CROSS-REFERENCE TO RELATED APPLICATIONS

This application claims priority to German patent application DE 10 2016 105 747.9, filed Mar. 30, 2016, entitled KONZEPT ZUM DETEKTIEREN EINES ENTKOPPELNS EINES ERSTEN STECKERTEILS EINES ELEKTRISCHEN STECKVERBINDERS VON EINEM ZWEITEN STECKERTEIL DES ELEKTRISCHEN STECKVERBINDERS, which is incorporated by reference herein, in its entirety and for all purposes.

FIELD

This disclosure relates to a method for detecting decoupling of a first connector part, connected to a first device, of an electrical plug or connector from a second connector part, connected to a second device, of the electrical plug or connector. The disclosure also relates to an apparatus for detecting decoupling of a first connector part, connected to a first device, of an electrical plug or connector from a second connector part, connected to a second device, of the electrical plug or connector. The disclosure furthermore relates to an electrical plug or connector comprising a first connector part and a second connector part.

BACKGROUND

DE 10 2013 205 786 A1 shows techniques for detecting removal of a connector. DE 60 2005 001 268 T2 (German translation of EP 1 714 371 B1) discloses an apparatus and a method for minimizing arc formation between electrical connectors. DE 102 25 259 B3 describes an electrical plug connector.

When opening a plug or connector to which a DC voltage is applied, an electric arc may be formed, which may be dangerous to persons and electrical devices, for example machines or the plug connector itself in the case of contact erosion. There is therefore a need to detect opening of a plug connector, with the result that a DC voltage applied to the plug connector can be switched off in order to avoid or at least reduce the formation of an electric arc.

SUMMARY

An objective of the present disclosure is to provide improved techniques for efficiently detecting decoupling of a first connector part, connected to a first device, of an electrical plug connector; e.g., from a second connector part, connected to a second device, of an electrical plug connector.

EXAMPLES

Some aspects of the disclosure provide methods for detecting decoupling of a first connector part, connected to a first device, of an electrical plug connector from a second connector part, connected to a second device, of the electrical plug connector; for example, wherein one or more of:
the first connector part comprising at least two first contacts for coupling a communication line between the first device and the second device,
at least two second contacts which lag the at least two first contacts during an unplugging operation and are intended to couple an electrical line between the first device and the second device, and
a protective conductor contact which lags the at least two second contacts during an unplugging operation,
the second connector part comprising at least two first mating contacts assigned to the at least two first contacts of the first connector part,
at least two second mating contacts which are assigned to the at least two second contacts of the first connector part and lag the at least two first mating contacts, and
a protective conductor mating contact which is assigned to the protective conductor contact of the first connector part and lags the at least two second contacts,
e.g., with the result that, during an unplugging operation, the first contacts are inevitably first disconnected from the first mating contacts, the second contacts are then disconnected from the second mating contacts, and finally the protective conductor contact is disconnected from the protective conductor mating contact.

Suitable methods can be performed according to any of the examples above; for example, comprising one or more of the following steps of:
providing a first electrical power for the second device by means of the first device via the electrical line,
monitoring the communication line,
terminating the provision of the first electrical power on the basis of the monitoring of the communication line.

Further aspects of the disclosure provide an apparatus for detecting decoupling of a first connector part, connected to a first device, of an electrical plug connector from a second connector part, connected to a second device, of the electrical plug connector; for example wherein one or more of:
the first connector part comprising at least two first contacts for coupling a communication line between the first device and the second device,
at least two second contacts which lag the at least two first contacts during an unplugging operation and are intended to couple an electrical line between the first device and the second device, and
a protective conductor contact which lags the at least two second contacts during an unplugging operation,
the second connector part comprising at least two first mating contacts assigned to the at least two first contacts of the first connector part,
at least two second mating contacts which are assigned to the at least two second contacts of the first connector part and lag the at least two first mating contacts, and
a protective conductor mating contact which is assigned to the protective conductor contact of the first connector part and lags the at least two second contacts,
e.g., with the result that, during an unplugging operation, the first contacts are inevitably first disconnected from the first mating contacts, the second contacts are then disconnected from the second mating contacts, and finally the protective conductor contact is disconnected from the protective conductor mating contact, Suitable applications of any of the above method and apparatus embodiments can be provided; for example, comprising one or more of:
a monitoring device for monitoring the communication line, and
a switching-off device for terminating provision of a first electrical power for the second device by means of the first device via the electrical line on the basis of the monitoring of the communication line.

Other aspects of the disclosure provide an electrical plug connector for electrically connecting a first device to a second device, comprising a first connector part and a second connector part; for example, wherein one or more of:
- the first connector part comprising at least two first contacts for coupling a communication line between the first device and the second device,
- at least two second contacts which lag the at least two first contacts during an unplugging operation and are intended to couple an electrical line between the first device and the second device, and
- a protective conductor contact which lags the at least two second contacts during an unplugging operation,
- the second connector part comprising at least two first mating contacts assigned to the at least two first contacts of the first connector part,
- at least two second mating contacts which are assigned to the at least two second contacts of the first connector part and lag the at least two first mating contacts, and
- a protective conductor mating contact which is assigned to the protective conductor contact of the first connector part and lags the at least two second contacts,
- e.g., with the result that, during an unplugging operation, the first contacts are inevitably first disconnected from the first mating contacts, the second contacts are then disconnected from the second mating contacts, and finally the protective conductor contact is disconnected from the protective conductor mating contact.

Another aspect provides the first connector part of the electrical plug connector. A further aspect provides the second connector part of the electrical plug connector.

Another aspect provides a device comprising the apparatus for detecting decoupling of a first connector part, connected to a first device, of an electrical plug connector from a second connector part, connected to a second device, of the electrical plug connector.

Another aspect provides a computer program product which is stored in a medium which can be used in a computer, comprising computer-readable programming means which can be used by a computer to carry out the method for detecting decoupling of a first connector part, connected to a first device, of an electrical plug connector from a second connector part, connected to a second device, of the electrical plug connector.

A suitable electrical plug connector can be configured according to the so-called "first mate-last break" concept. The wording "first mate-last break" can also be abbreviated with the letters FMLB. In suitable plug connector configurations, provision can therefore be made for the first contacts and/or the first mating contacts, which are provided for the purpose of coupling the communication line between the first and second devices, to be disconnected first during an unplugging operation. The second contacts are then disconnected from the second mating contacts. Finally, the protective conductor contact is disconnected from the protective conductor mating contact.

The plug connector is therefore configured as a multistage plug connector, the plurality of stages being successively disconnected from one another during an unplugging operation and/or being successively coupled during a plugging-in operation. The plurality of stages each correspond to the first contacts and/or the first mating contacts, the second contacts and/or the second mating contacts and the protective conductor contact and/or the protective conductor mating contact. A first stage therefore comprises the first contacts and/or the first mating contacts. A second stage therefore comprises the second contacts and/or the second mating contacts. A third stage therefore comprises the protective conductor contact and/or the protective conductor mating contact.

That is to say, decoupling of the first connector part from the second connector part will initially have a detectable influence or a detectable effect on the communication line. This is because the communication line is disconnected first during an unplugging operation on account of the FMLB design. Whereas the communication line has therefore already been disconnected, the electrical line is still intact. That is to say, the second contacts are electrically connected to the second mating contacts. An electric arc therefore cannot yet be formed even though the unplugging operation has already started. Time is therefore gained in order to terminate the provision of the first power via the electrical line in good time so that an electric arc is not formed and/or an electric arc which has been formed can be minimized and/or can be quenched as quickly as possible. The provision of the first electrical power via the electrical line is terminated on the basis of the monitoring of the communication line. As a result of the fact that disconnection or opening of the plug connector initially results in disconnection of the communication line, the disconnection or opening of the plug connector can be efficiently detected or identified on the basis of the monitoring of the communication line. As soon as disconnection or opening of the plug connector is therefore identified or detected on the basis of the monitoring of the communication line, these techniques can provide for the provision of the first electrical power via the electrical line to be terminated. This therefore advantageously avoids the formation of an electric arc and/or makes it possible to efficiently quench an electric arc which has already been formed.

The practice of providing a plug connector, which is configured according to the "first mate-last break" concept, together with the practice of monitoring the communication line, therefore can achieve the technical advantage, in particular, that a technique for efficiently detecting decoupling of a first connector part, connected to a first device, of an electrical plug connector from a second connector part, connected to a second device, of the electrical plug connector is provided, formation of an electric arc on account of an unplugging operation being avoided and/or an electric arc which has possibly been formed being able to be quenched efficiently and quickly. This therefore advantageously means that a risk to persons and to the first and/or second device can be reduced. In particular, this makes it possible to avoid or at least reduce damage to the plug connector on account of contact erosion.

One embodiment provides for the contacts of the first connector part to each be configured as an electrical contact pin and for the mating contacts of the second connector part to each be configured as an electrical contact cup or vice versa.

Some embodiments provide one or more of the following steps of:
- providing a second electrical power for the second device by means of the first device via the communication line,
- the monitoring comprising monitoring of an electrical variable corresponding to the second electrical power provided, in particular an electrical supply current and/or an electrical supply voltage,
- the provision of the first electrical power being terminated on the basis of the monitored electrical variable.

This can achieve the technical advantage, in particular, that decoupling can be efficiently detected. This is because disconnection of the communication line will become immediately noticeable in the electrical variable. That is to say, disconnection of the communication line immediately influences the electrical variable. For example, an electrical supply current will immediately drop. For example, an electrical supply voltage will immediately rise. Such a change in the current flow or in the applied voltage can be efficiently measured and therefore detected.

One embodiment of the method provides for the monitored electrical variable to be compared with a predefined threshold value, the provision of the first electrical power being terminated on the basis of the comparison. If the electrical supply current is measured as the electrical variable, one embodiment provides for the provision of the first electrical power to be terminated if the electrical supply current is less than, or less than or equal to, the predefined threshold value. If the electrical supply voltage is measured as the electrical variable, one embodiment provides for the provision of the first electrical power to be terminated if the electrical supply voltage is greater than, or greater than or equal to, the predefined threshold value.

If the second electrical power provided via the communication line is measured as the electrical variable, one embodiment provides for the provision of the first electrical power to be terminated if the second electrical power is less than, or less than or equal to, the predefined threshold value. The practice of monitoring the second electrical power has the additional advantage over monitoring a supply current, in particular, that it is possible to obtain a value (measured second electrical power) which is still constant in the case of a fluctuating supply voltage and is then compared with the threshold value. In order to measure, that is to say monitor, the second electrical power, provision is therefore made for both the electrical supply current and the electrical supply voltage to be measured, in particular at the same time.

One embodiment provides for a plurality of electrical variables, in particular an electrical supply voltage, in particular an electrical supply current, in particular the second electrical power, to be monitored, each of which electrical variables is compared with its own predefined threshold value, the provision of the first electrical power being terminated on the basis of the respective comparisons.

The practice of predefining a threshold value can achieve the technical advantage, in particular, that the decoupling can be efficiently detected. This is because the practice of predefining a manipulated variable is an efficient switching-off criterion, on the basis of which it is possible to efficiently decide whether or not the provision of the first electrical power is intended to be terminated.

In particular, the practice of predefining a threshold value enables efficient adaptation to specific boundary conditions, for example particular devices and/or particular supply voltages. One embodiment of the method provides for the provision of the second electrical power to comprise application of an electrical supply voltage of 24 V to the communication line, with the result that a supply current of at least 60 mA can flow, the predefined threshold value being 30 mA.

Another embodiment provides for the monitoring of the communication line to comprise monitoring of a data connection between the first device and the second device, the provision of the first electrical power being terminated if a discontinuation in the data connection has been detected on the basis of the monitoring of the data connection. This can achieve the technical advantage, for example, that a simple monitoring possibility with simple implementation is provided.

One embodiment provides for the two devices to each have a PHY (physical interface, also called Ethernet Physical Layer) for communication via the data connection. Such a PHY provides a simple possible way of detecting errors in the data connection without additional hardware, with the result that, in the event of one or more errors being present in the data connection, it is possible to determine that there is a discontinuation in the data connection.

Another embodiment provides for a frame comprising useful data and one or more checksums for the useful data to be transmitted between the first device and the second device via the data connection, the useful data being checked for an error by checking the checksum, a discontinuation in the data connection being detected if the checking has revealed that the useful data have an error or have exceeded a predetermined number of errors (a predetermined number of errors may also be referred to as an error threshold value) or a predetermined number of errors inside the frame. This can achieve the technical advantage, in particular, that a connection discontinuation can be efficiently detected.

One embodiment provides for the first device and the second device to be subscribers of a bus system. This can achieve the technical advantage, for example, that the bus system can be operated in an efficient and reliable manner.

In one embodiment, the first device is an input/output module. In one embodiment, the second device is an input/output module. In one embodiment, the first device is an energy distribution module. In one embodiment, the second device is an energy distribution module.

One aspect provides a bus system comprising two devices which are connected to one another in an electrically conductive manner by means of the electrical plug connector. According to one embodiment, a communication connection comprises a communication connection according to the EtherCAT standard.

According to one embodiment, the bus system is configured for use in industrial automation. Therefore, according to one embodiment, the bus system is an industrial automation bus system or a bus system for industrial automation.

One embodiment provides for the apparatus for detecting decoupling to be configured or set up to carry out or perform the method for detecting decoupling. Technical functionalities of the method similarly result from corresponding technical functionalities of the apparatus and vice versa. That is to say, in particular, apparatus features may result from corresponding method features and vice versa.

One embodiment provides for the method for detecting decoupling to be performed or carried out by means of the apparatus for detecting decoupling. Features of the electrical plug connector and/or of the first connector part of the electrical plug connector and/or of the second connector part of the electrical plug connector similarly may result from corresponding features of the method and/or the apparatus and vice versa.

One embodiment provides for the monitoring device to be configured to monitor an electrical variable corresponding to a second electrical power provided by means of the first device via the communication line, in particular an electrical supply current and/or an electrical supply voltage, the switching-off device being configured to terminate the provision of the first electrical power on the basis of the monitored electrical variable.

Another embodiment provides for the monitoring device to be configured to compare the monitored electrical variable with a predefined threshold value, the switching-off device being configured to terminate the provision of the first electrical power on the basis of the comparison.

One embodiment provides for the switching-off device to be configured to terminate the provision of the first electrical power if, when measuring the electrical supply current as the electrical variable, the electrical supply current is less than, or less than or equal to, the predefined threshold value.

One embodiment provides for the switching-off device to be configured to terminate the provision of the first electrical power if, when measuring the electrical supply voltage as the electrical variable, the electrical supply voltage is greater than, or greater than or equal to, the predefined threshold value.

One embodiment provides for the switching-off device to be configured to terminate the provision of the first electrical power if, when measuring the second electrical power, the second electrical power is less than, or less than or equal to, the predefined threshold value. In order to measure, that is to say monitor, the electrical power, provision is therefore made for both the electrical supply current and the electrical supply voltage to be measured, in particular at the same time.

Another embodiment provides for the predefined threshold value to be 30 mA if the provided second electrical power comprises an electrical supply voltage of 24 V applied to the communication line, with the result that a supply current of at least 60 mA can flow. Another embodiment provides for the monitoring device to be configured to monitor a data connection between the first device and the second device, the switching-off device being configured to terminate the provision of the first electrical power if a discontinuation in the data connection has been detected on the basis of the monitoring of the data connection.

A further embodiment provides for the monitoring device to be configured to check the useful data for one or more errors by checking a checksum or checksums for useful data in a frame which is transmitted between the first device and the second device via the data connection and comprises the checksum(s), with the result that a discontinuation in the data connection is detected if the checking has revealed that the useful data have an error or have exceeded a predetermined number of errors or a predetermined number of errors within the frame.

According to one embodiment, the switching-off device comprises one or more transistors, in particular field effect transistors, for example metal oxide semiconductor field effect transistors (MOSFET), in particular power MOSFETs. According to one embodiment, the monitoring device comprises one or more microcontrollers.

According to one embodiment, the monitoring device comprises a current measuring device for measuring the electrical supply current. According to one embodiment, the monitoring device comprises a voltage measuring device for measuring the supply voltage. According to one embodiment, the monitoring device comprises both a voltage measuring device for measuring the supply voltage and a current measuring device for measuring the electrical supply current.

In one embodiment, four first contacts are provided. In one embodiment, four first mating contacts are provided.

In one embodiment, exactly two first contacts are provided. In one embodiment, exactly two first mating contacts are provided.

In one embodiment, the plug connector is configured as a BroadR-Reach plug connector. That is to say, in particular, a data connection is configured via the communication line according to the BroadR-Reach with PoDL standard.

One embodiment provides for the device to be configured to provide a second electrical power via the communication line. The device may be, for example, the first device or the second device.

One embodiment provides for the device to comprise one or more voltage supplies, in particular a DC voltage supply and/or an AC voltage supply. That is to say, in particular, a DC voltage or an AC voltage, for example, can be provided, in particular for the second device, by means of the voltage supply via the communication line according to one embodiment. A supply voltage which is provided via the communication line is 24 V, for example, in particular at most 24 V. For example, two supply voltages are respectively provided via the communication line, for example two voltages of 24 V, in particular two voltages of at most 24 V.

A suitable supply voltage in the scope of the present disclosure can have a tolerance of +20%/−15%, for example, or other suitable tolerance range. This may achieve the technical advantage, for example, of compliance with the IEC61131 standard. That is to say, in particular, with a supply voltage of 24 V, for example, this voltage may be between 20.4 V and 28.8 V.

According to one embodiment, an AC voltage or a DC voltage is provided via the electrical line, in particular by means of the voltage supply or by means of a further one of the plurality of voltage supplies. The voltage provided can be, for example, 230 V, 400 V or 600 V, in particular 230 VAC, 400 VAC or 600 VDC.

According to one embodiment, the first connector part comprises at least two third contacts which lag the at least two second contacts during an unplugging operation and are intended to couple a second electrical line between the first device and the second device, the second connector part having at least two third mating contacts which are assigned to the at least two third contacts of the first connector part and lag the at least two second mating contacts, with the result that the third contacts are inevitably disconnected from the third mating contacts after the second contacts during an unplugging operation and finally the protective conductor contact is disconnected from the protective conductor mating contact.

This principle can be continued, with the result that, according to a further embodiment, the first connector part, for example, comprises at least two nth contacts which lag the at least two nth contacts during an unplugging operation and are intended to couple an nth line between the first device and the second device, the second connector part comprising at least two nth mating contacts which are assigned to the at least two nth contacts of the first connector part and lag the at least two nth mating contacts, where n is a natural number and is greater than or equal to 2.

According to one embodiment, the first connector part is configured as a male connector part of the electrical plug connector, and the second connector part is configured as a female connector part of the electrical plug connector, or vice versa.

According to one embodiment, the male connector part is configured as a plug, in particular a built-in plug. According to one embodiment, the female connector part is configured as a coupling, in particular a socket.

A contact in the sense of the present disclosure, that is to say, in particular, the first contacts and/or the second contacts, generally the nth contacts, and/or the protective conductor contact, is configured as a contact pin according to one embodiment. A contact in the sense of the present disclosure, that is to say, in particular, the first contacts and/or the second contacts, generally the nth contacts, and/or the protective conductor contact, is configured as a contact cup according to one embodiment.

In one embodiment, the contacts are different or identical. That is to say, in particular, one or more contacts, that is to say, in particular, the first contacts and/or the second contacts, generally the nth contacts, and/or the protective conductor contact, are each configured as a contact pin, one or more further contacts each being configured as a contact cup.

A mating contact in the sense of the present disclosure, that is to say, in particular, the first mating contacts and/or the second mating contacts, generally the nth mating contacts, and/or the protective conductor mating contact, is configured as a contact pin according to one embodiment. A mating contact in the sense of the present disclosure, that is to say, in particular, the first mating contacts and/or the second mating contacts, generally the nth mating contacts, and/or the protective conductor mating contact, is configured as a contact cup according to one embodiment.

In one embodiment, the mating contacts are different or identical. That is to say, in particular, one or more mating contacts, that is to say, in particular, the first mating contacts and/or the second mating contacts, generally the nth mating contacts, and/or the protective conductor mating contact, are each configured as a contact pin, one or more further mating contacts each being configured as a contact cup.

The practice of providing differently configured contacts and/or mating contacts advantageously makes it possible to achieve the situation in which the first connector part and/or the second connector part has/have coding. Such coding comprises, for example, the information relating to which communication method is intended to be used between the two devices. In particular, such coding comprises information relating to whether or not an electrical power can be applied to the communication line. For example, with appropriate coding, it is possible to distinguish between an EtherCAT plug connector and an EtherCAT P plug connector.

In one embodiment, a contact pin is configured as a spring contact pin. In one embodiment, a contact cup is configured as a spring contact cup.

In one embodiment, a contact is configured as a spring contact. In one embodiment, a mating contact is configured as a spring mating contact.

According to one embodiment, the communication line, the electrical line(s) and the protective line are included in a common cable.

In one embodiment, the switching-off device is configured to switch off the voltage supply. In one embodiment, the switching-off device is configured to interrupt an electrical connection between the voltage supply and the electrical line.

According to one embodiment, the communication line is configured as a multicore communication line, with the result that each of the plurality of cores of the communication line makes electrical contact with one of the plurality of first contacts.

According to one embodiment, the electrical line is configured as a multicore electrical line, with the result that each of the plurality of cores of the electrical line makes electrical contact with one of the plurality of second contacts.

According to one embodiment, the communication line is configured as a four-core communication line, with the result that each of the four cores of the communication line makes electrical contact with one of the four first contacts. Two supply voltages, one supply voltage for each pair of cores, are applied to a four-core communication line, for example.

According to one embodiment, the electrical line is configured as a two-core electrical line, with the result that each of the two cores of the electrical line makes electrical contact with one of the two second contacts. One supply voltage is applied to a two-core electrical line, for example.

One embodiment provides for the device, the first and/or the second device, to be configured to provide a first electrical power via the electrical line. One embodiment provides for the device, the first and/or the second device, to be configured to provide a second electrical power via the communication line.

A computer program product is understood as meaning, in particular, a computer program stored on a non-transitory computer-readable data storage medium, or other suitable carrier. The carrier may be, for example, a CD, a DVD, a ROM, a RAM, a BD (Blu-ray disc) or an electronic device.

A computer program product is understood as meaning, in particular, an embedded system having a computer program stored on a suitable carrier, for example an electronic device having a computer program. A computer program product is understood as meaning, in particular, a computer on which a computer program, in particular, is loaded, for example runs, is preferably stored, for example executed or developed, for example. A computer program product is understood as meaning, in particular, a discrete or integrated circuit which is configured to perform the method according to the disclosure.

BRIEF DESCRIPTION OF THE DRAWINGS

The invention is explained in greater detail below on the basis of preferred exemplary embodiments with reference to figures, in which:

FIG. 5 shows a flowchart of a method for detecting decoupling of a first connector part of an electrical plug connector from a second connector part of the electrical plug connector.

DETAILED DESCRIPTION

Figure 1:
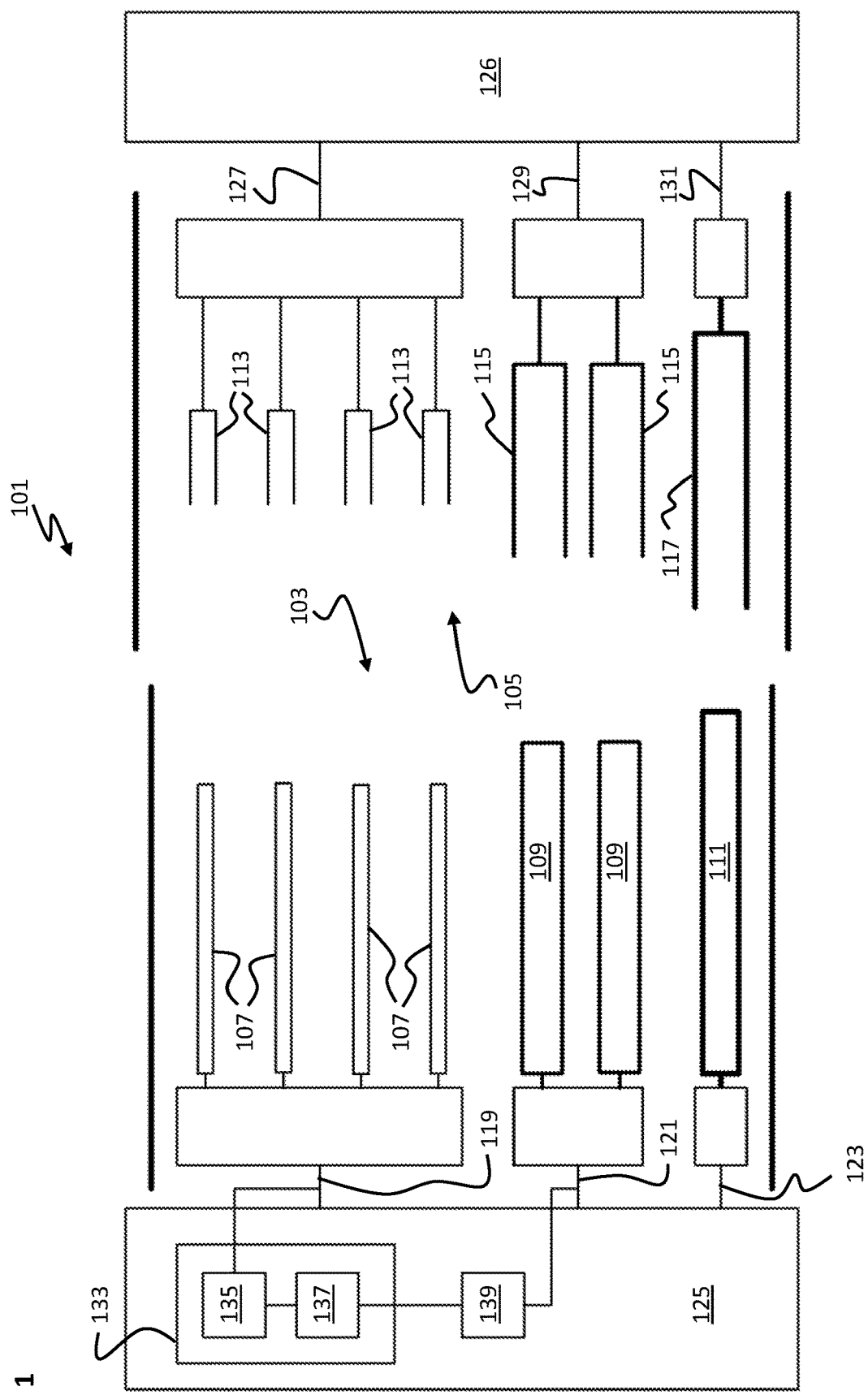
FIG. 1 shows an electrical plug connector.

FIG. 1 shows an electrical plug connector 101. The plug connector 101 comprises a first connector part 103 and a second connector part 105. The first connector part 103 is configured as a male connector part of the plug connector 101, for example, and the second connector part 105 is configured as a female connector part of the plug connector 101, or vice versa.

The first connector part 103 comprises four first contacts 107. The first connector part 103 also comprises two second contacts 109. The first connector part 103 also comprises a protective conductor contact 111. The contacts 107, 109, 111 of the first connector part 103 are each configured as an electrical contact pin, for example.

The two second contacts 109 lag the four first contacts 107 during an unplugging operation. That is to say, the four first contacts 107 lead the second contacts 109 during an unplugging operation.

The two second contacts 109 lead the protective conductor contact 111 during an unplugging operation. That is to say, the protective conductor contact 111 lags the second contacts 109 during an unplugging operation.

The second connector part 105 comprises four first mating contacts 113 which are assigned to the four contacts 107 of the first connector part 103. The second connector part 105 also comprises two mating contacts 115 which are assigned to the two second contacts 109 of the first connector part 103. The second connector part 105 also comprises a protective conductor mating contact 117 which is assigned to the protective conductor contact 111 of the first connector part 103.

The four first mating contacts 113 lead the two second mating contacts 115 during an unplugging operation. That is to say, the two second mating contacts 115 lag the four first mating contacts 113 during an unplugging operation.

The protective conductor mating contact 117 lags the two second mating contacts 115 during an unplugging operation. That is to say the two second mating contacts 115 lead the protective conductor mating contact 117 during an unplugging operation.

The mating contacts 113, 115, 117 of the second connector part 105 are each configured as an electrical contact cup, for example. Alternatively, provision is made, for example, for the corresponding mating contacts 113, 115 and 117 of the second connector part 105 to be configured in one plane in the case of a leading configuration of the contacts 107, 109 and 111 of the first connector part 103 according to the above description provided that the leading decoupling described is ensured during the unplugging operation. This embodiment is not illustrated in the figures.

Alternatively, provision is made, for example, for the corresponding contacts 107, 109 and 111 of the first connector part 103 to be configured in one plane in the case of a leading configuration of the mating contacts 113, 115 and 117 of the second connector part 105 according to the above description provided that the leading decoupling described is ensured during the unplugging operation. This embodiment is likewise not illustrated in the figures.

It is noted at this point that a contact and its corresponding mating contact do not touch in the plugged or coupled state according to the drawings in FIGS. 1 to 4. However, this circumstance is due merely to reasons of illustration and clarity. It goes without saying that the contact is connected to its corresponding mating contact in an electrically conductive manner in the plugged or coupled state by virtue of the contact making contact with, that is to say touching, its corresponding mating contact.

In a plugged state, that is to say when the first connector part 103 is completely coupled to the second connector part 105, the respective contacts 107, 109, 111 are electrically connected to their respective assigned mating contacts 113, 115, 117. During an unplugging operation, that is to say when the two connector parts 103, 105 are disconnected or decoupled from one another, the first contacts 107 are inevitably first disconnected from the first mating contacts 113, the second contacts 109 are then disconnected from the second mating contacts 115 and finally the protective conductor contact 111 is disconnected from the protective conductor mating contact 117.

That is to say, the electrical plug connector 101 is an FMLB plug connector. During an unplugging operation, the protective conductor contact 111 is therefore always disconnected from the protective conductor mating contact 117 last. This makes it possible to advantageously comply with legal standards or provisions, for example. Furthermore, an electric shock for a person can be advantageously reduced or avoided.

The first connector part 103 is connected to a first device 125 in an electrically conductive manner. Provided for this connection is a communication line 119 which connects the first contacts 107 to the device 125. The communication line 119 is configured, for example, as a four-core communication line, with the result that each of the four cores makes electrical contact with one of the four first contacts 107.

An electrical line 121 is also provided and connects the second contacts 109 to the first device 125 in an electrically conductive manner. For example, the electrical line 121 is configured as a two-core electrical line, with the result that each of the two cores makes electrical contact with one of the two second contacts 109. A protective conductor 123 is also provided and connects the protective conductor contact 111 to the first device 125 in an electrically conductive manner.

In the illustration shown in FIG. 1, the first connector part 103 of the electrical plug connector 101 is arranged outside the first device 125. However, according to one embodiment, the first connector part 103 may also be configured as a built-in plug or a built-in socket and may therefore be integrated in the first device 125. In this case, the communication line 119, the electrical line 121 and the protective conductor 123 run inside the device 125.

In a similar manner to the first connector part 103, the second connector part 105 of the electrical plug connector 101 is connected to a second device 126. Accordingly, a further communication line 127 connects the first mating contacts 113 to the second device 126 in a conductive manner. The further communication line 127 is configured, for example, as a four-core communication line, with the result that each of the four cores makes electrical contact with one of the four first mating contacts 113.

Accordingly, a further electrical line 129 connects the two second mating contacts 115 to the second device 126 in an electrically conductive manner. For example, the further electrical line 129 is configured as a two-core electrical line, with the result that each of the two cores makes electrical contact with one of the two second mating contacts 115. In a similar manner, a further protective conductor 131 is provided and electrically connects the protective conductor mating contact 117 to the second device 126.

In the illustration shown in FIG. 1, the second connector part 105 is arranged outside the second device 126. An embodiment provides, for example, for the second connector part 105 to be configured as a built-in plug or a built-in socket and to therefore be integrated in the second device 126. In this case, the further communication line 127, the further electrical line 129 and the further protective conductor 131 then run inside the second device 126.

In an embodiment, the plug connector 101 is configured as a coupling. If the two connector parts 103, 105 are completely coupled, that is to say if the electrical plug connector 101 is closed, an electrically conductive connection is formed between the communication line 119 and the further communication line 127. Furthermore, the two electrical lines 121, 129 are thereby connected to one another in an electrically conductive manner. The two protective conductors 123, 131 are likewise connected to one another in an electrically conductive manner.

The two devices 125, 126 can therefore communicate with one another via the communication lines 119, 127. In particular, the first device 125 can provide the second device 126 with an electrical power via the electrical line 121 and therefore then also via the further electrical line 129.

For this purpose, the first device 125 has, for example, a voltage supply 139 which can apply a voltage, for example a DC voltage or an AC voltage, to the two second contacts 109 via the electrical line 121. According to one embodiment, the voltage supply 139 is configured to apply a second electrical voltage, for example an AC voltage or a DC voltage, to the four first contacts 107 via the communication line 119.

One embodiment provides for a further voltage supply to be provided for the purpose of applying such a voltage to the four contacts 107. It is therefore advantageously possible for the first device 125 to provide the second device 126 with an electrical voltage, in particular an AC voltage or a DC voltage, via the two contacts 109. In particular, it is thereby advantageously possible for the first device 125 to provide and/or to be able to provide the second device 126 with one or more second electrical voltages, for example a DC voltage or an AC voltage, via the four first contacts 107. That is to say, the communication line 119 is and/or can be efficiently used both for communication and for a voltage supply.

If a voltage, in particular a DC voltage, is applied to the two second contacts 109 in the plugged state, an electric arc may be formed during an unplugging operation. In order to prevent such formation of an electric arc and/or to efficiently and quickly quench an electric arc which has possibly been formed, it is useful to detect decoupling of the first connector part 103 from the second connector part 105 and this is therefore provided. For this purpose, the first device 125 comprises an apparatus 133 for detecting decoupling of the first connector part 103, connected to the first device 125, of the electrical plug connector 101 from the second connector part 105, connected to the second device 126, of the electrical plug connector 101.

The apparatus 133 comprises a monitoring device 135 which is configured to monitor the communication line 119. The apparatus 133 also comprises a switching-off device 137 which is configured to terminate provision of a first electrical power for the second device 126 by means of the first device 125 via the electrical line 121 on the basis of the monitoring of the communication line 119. For example, the switching-off device 137 is configured to switch off the voltage supply 139. For example, the switching-off device 137 is configured to interrupt an electrical connection between the voltage supply 139 and the electrical line 121.

If the second device 126 is provided with a second electrical power by means of the first device 125 using the communication line 119, one embodiment provides for the monitoring device 135 to monitor an electrical supply current and/or an electrical supply voltage.

If the first connector part 103 is disconnected from the second connector part 105, a drop in the electrical supply current and/or a rise in the electrical supply voltage is measured as soon as the four first contacts 107 no longer make electrical contact with the four first mating contacts 113. If the measured supply current falls below a predetermined threshold value and/or the measured supply voltage rises above a predetermined threshold value, the switching-off device 137 is instructed to terminate the provision of the electrical power via the electrical line 121, for example by switching off the voltage supply 139 and/or disconnecting an electrical connection between the voltage supply 139 and the electrical line 121.

That is to say, in particular, according to one embodiment, an electrical supply current which flows from the first device 125 to the second device 126 via the communication lines 119, 127 is monitored. If the electrical plug connector 101 is opened, the opening becomes immediately noticeable by a change, more specifically a drop, in the supply current at the supplying device, here the first device 125, which can therefore be measured. If the supply current drops, a latency of a further electronic component, which is connected in the electrical circuit comprising the communication line 119, is taken into account, for example. This may be a coil, for example.

If the supply current falls below a defined limit, that is to say below a predefined threshold value, provision is made, in particular, for a voltage supply to be switched off via the electrical line 121. One embodiment provides for the voltage supply to be switched off via the electrical line 121 if the measured supply current is greater than, or greater than or equal to, a predefined further threshold value.

These techniques enable a simple measurement set-up and a very low latency and a very low sensitivity to other interference in communication between the two devices 125, 126, the cause of which possibly does not lie in the electrical plug connector 101.

Another embodiment provides for a communication connection between the two devices 125, 126 to be monitored. Such a communication connection is formed, for example, by means of the communication lines 119, 127.

If the electrical plug connector 101 is opened, this is detected by a connection discontinuation in communication. If such a connection discontinuation is therefore identified or detected, the voltage supply 139 is switched off and/or an electrical connection between the voltage supply 139 and the electrical line 121 is interrupted in a manner similar to that described above in connection with the monitoring of the electrical variable. The first connector part 103, the second connector part 105 and the two devices 125, 126 are each also individually disclosed per se.

Figure 2:
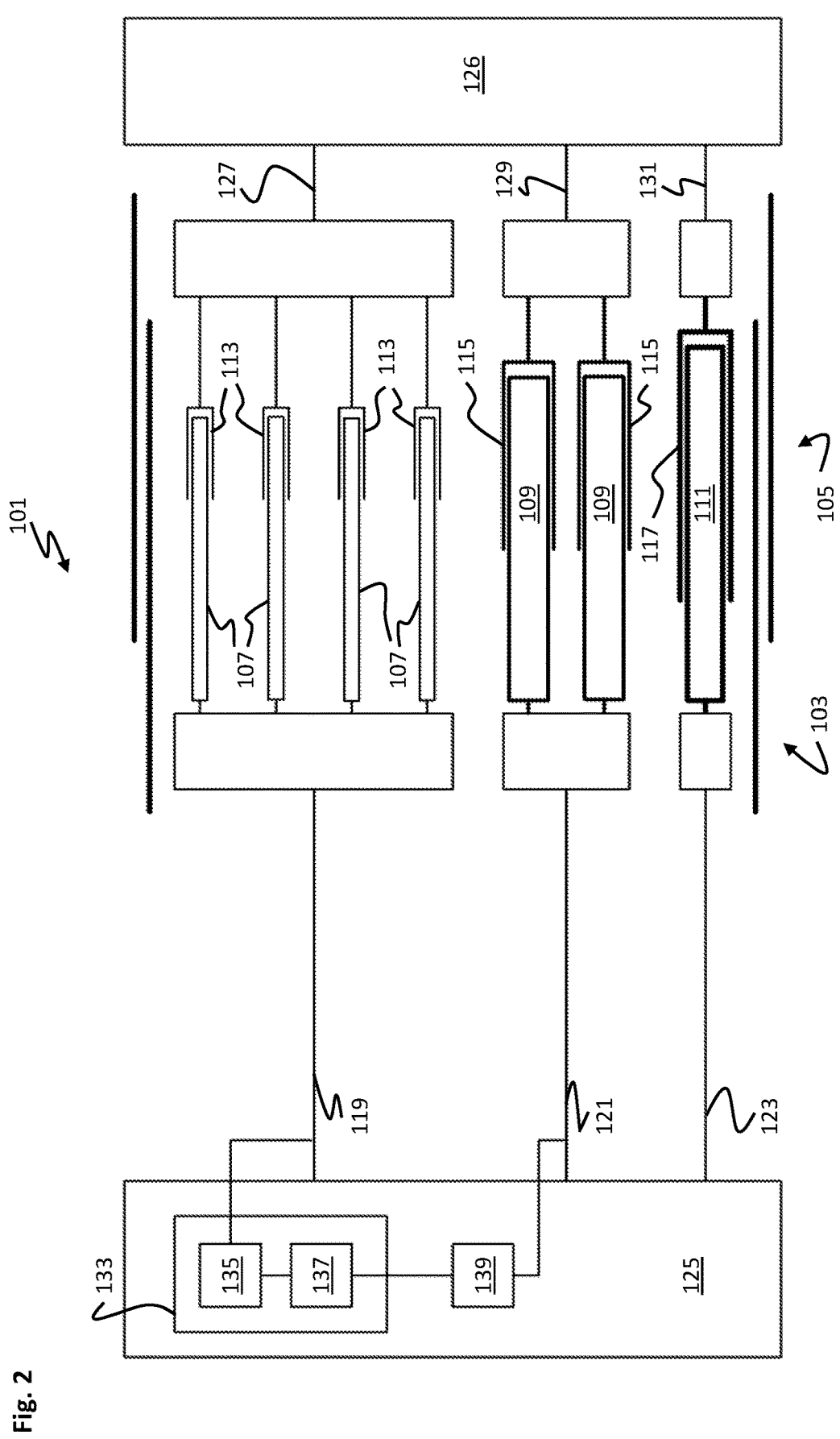
FIGS. 2 to 4 each show a time of an unplugging operation in the case of the electrical plug connector according to FIG. 1.
Figure 3:
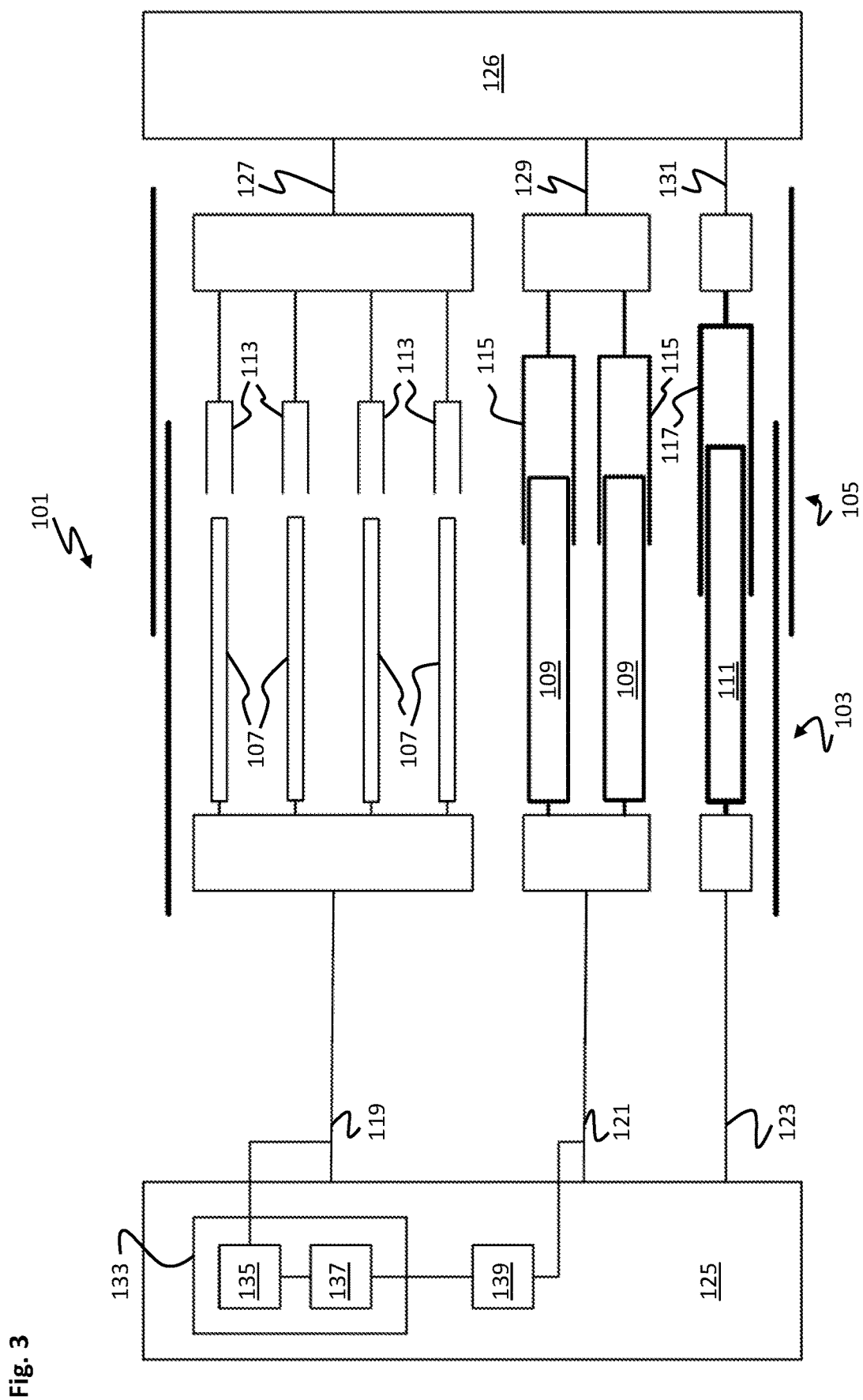
Figure 4:
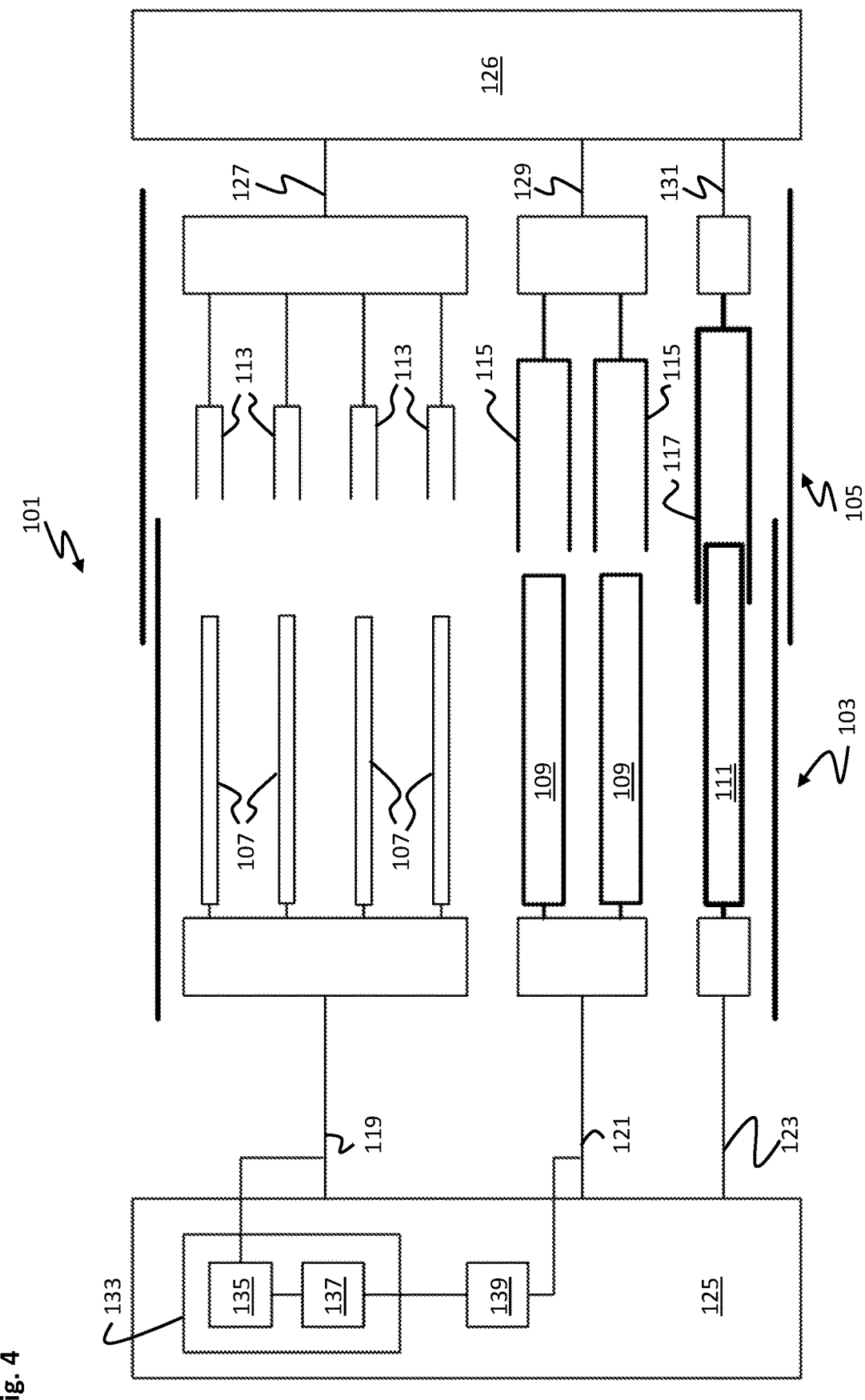

FIGS. 2 to 4 each show a successive time of an operation of unplugging the first connector part 103 from the second connector part 105. In the illustration shown in FIG. 2, the electrical plug connector 101 is completely closed. That is to say, all contacts 107, 109, 111 of the first connector part 103 make electrical contact with the corresponding mating contacts 113, 115, 117 of the second connector part 105.

FIG. 3 shows the electrical plug connector 101 at a time at which the four first contacts 107 have already been disconnected from the four first mating contacts 113. The two second contacts 109 still make contact with the two second mating contacts 115. Furthermore, the protective conductor contact 111 makes contact with the protective conductor mating contact 117. At this time, a drop in a supply current and/or a connection discontinuation of a communication connection between the two devices 125, 126 can be measured or detected. At this time, an electric arc may also not yet be formed provided that the two second contacts 109 still make electrical contact with the two second mating contacts 115. However, since the decoupling can already be detected at this time on account of the discontinuation in the communication connection and/or the drop in the supply current, the voltage supply 139 is switched off and/or an electrical connection between the voltage supply 139 and the electrical line 121 is interrupted, with the result that a voltage is no longer applied to the second contacts 109.

FIG. 4 shows the electrical plug connector 101 at a time at which only the protective conductor contact 111 is still electrically connected to the protective conductor mating contact 117. The first contacts 107 and the second contacts 109 have already been disconnected from their respective mating contacts 113, 115. That is to say, the protective conductor 123 is disconnected from the further protective conductor 131 last during an unplugging operation.

FIG. 5 shows a flowchart of a method for detecting decoupling of a first connector part, connected to a first device, of an electrical plug connector from a second connector part, connected to a second device, of the electrical plug connector; for example, including one or more of the following:

the first connector part comprising at least two first contacts for coupling a communication line between the first device and the second device, at least two second contacts which lag the at least two first contacts during an unplugging operation and are intended to couple an electrical line between the first device and the second device, and a protective conductor contact which lags the at least two second contacts during an unplugging operation, the second connector part comprising at least two first mating contacts assigned to the at least two first contacts of the first connector part, at least two second mating contacts which are assigned to the at least two second contacts of the first connector part and lag the at least two first mating contacts, and a protective conductor mating contact which is assigned to the protective conductor contact of the first connector part and lags the at least two second contacts, with the result that, during an unplugging operation, the first contacts are inevitably first disconnected from the first mating contacts, the second contacts are then disconnected from the second mating contacts, and finally the protective conductor contact is disconnected from the protective conductor mating contact, The method can be performed comprising one or more of the following steps of:

providing 501 a first electrical power for the second device by means of the first device via the electrical line, monitoring 503 the communication line, terminating 505 the provision of the first electrical power on the basis of the monitoring of the communication line.

One embodiment provides for the communication line to be monitored even before the first electrical power is provided. In particular, provision is made for a first electrical power to be provided via the communication line only when the monitoring has revealed that a second device, which can be referred to as a communication subscriber in particular, has to be supplied with an electrical power.

One embodiment provides for the communication line to be monitored and for an electrical variable corresponding to the second electrical power provided to be monitored even before the first electrical power is provided. In particular, provision is made for a first power to be provided only when the monitoring of the communication line reveals that the line is connected to a second communication subscriber. That is to say, in particular, the first electrical power is provided and an electrical variable corresponding to the second electrical power provided is monitored even before the second electrical power is provided. The practice of monitoring the electrical variable advantageously makes it possible to detect whether a second communication subscriber (second device) is connected.

According to a further embodiment, a second threshold value and/or second threshold values, for example a maximum electrical current and/or a maximum electrical power and/or a minimum electrical voltage, is/are and/or has/have been predefined for the measured electrical variable(s) on the communication line, the measured electrical variable(s) being compared with its/their respective second threshold values, in which case it is determined, on the basis of the comparison, that the communication line has been short-circuited. That is to say, if the current and/or power exceed(s) the respective second threshold value, it is determined that the communication line has been short-circuited. That is to say, if the voltage falls below the corresponding second threshold value, it is determined that the communication line has been short-circuited. That is to say, in particular, a short circuit is identified if the second threshold values are exceeded and/or undershot. If a short circuit is identified, that is to say if it has been determined that the communication line has been short-circuited, provision of the first electrical power is blocked according to this embodiment.

This has the technical advantage, in particular, that an open line end, which has become electrically conductive as a result of soiling for example, is not identified as a communication subscriber which needs to be supplied. This therefore prevents, in particular, a first power being provided at an open plug connector.

According to a further method, the first electrical power is provided only when a communication connection has been set up via the communication line between the first subscriber (first device) and the second subscriber (second device). This has the advantage, in particular, that a communication subscriber is unequivocally identified and the first electrical power is provided only when a closed connection certainly exists. This embodiment has the advantage, in particular, that the technical implementation is particularly simple since the correct setting-up of a connection can be easily implemented with the aid of existing means. In particular, no further hardware is therefore required for this purpose.

In summary, an efficient technique for efficiently detecting decoupling of a first connector part, connected to the first device, of an electrical plug connector from a second connector part, connected to a second device, of the electrical plug connector is provided. In particular, formation of an electric arc can be efficiently avoided and/or an electric arc which has possibly been produced can be efficiently and quickly quenched.

This invention has been described with respect to exemplary embodiments. It is understood that changes can be made and equivalents can be substituted to adapt these disclosures to different materials and situations, while remaining with the scope of the invention. The invention is thus not limited to the particular examples that are disclosed, but encompasses all the embodiments that fall within the scope of the claims.

What is claimed is:

1. A method for detecting decoupling of a first connector part, connected to a first device, of an electrical plug connector from a second connector part, connected to a second device, of the electrical plug connector, the first connector part comprising at least two first contacts being configured for coupling a communication line to the first device, at least two second contacts being configured for coupling an electrical line to the first device, and a protective conductor contact;

the second connector part comprising at least two first mating contacts assigned to the at least two first contacts of the first connector part, the two first mating contacts being configured for coupling a further communication line to the second device, at least two second mating contacts which are assigned to the at least two second contacts of the first connector part, the two second contacts being configured for coupling a further electrical line to the second device and a protective conductor mating contact which is assigned to the protective conductor contact of the first connector part;

the plug connector being configured as a multistage plug connector having a first stage, a second stage and a third stage, the first stage comprising the first contacts and the first mating contacts, the second stage comprising the second contacts and the second mating contacts, the third stage comprising the protective conductor contact and the protective conductor mating contact, wherein the first stage, the second stage and the third stage are configured for successively disconnecting from one another during an unplugging operation and for successively coupling during a plugging-in operation with the result that, during the unplugging operation, the first contacts are first disconnected from the first mating contacts, the second contacts are then disconnected from the second mating contacts, and finally the protective conductor contact is disconnected from the protective conductor mating contact, the first and second devices each have an Ethernet physical layer for communication via the data connection, the method comprising the following steps of:

providing a first electrical power for the second device by the first device and a data connection between the first device and the second device via the communication lines during the plugging-in operation of the first stage, providing a second electrical power for the second device by the first device via the electrical lines during the plugging-in operation of the second stage, monitoring at least one communication line for the unplugging operation of the first stage the monitoring comprising determining a discontinuation in the data connection, wherein the Ethernet physical layer detects an error in the data connection to determine that there is a discontinuation in the data connection, terminating the provision of the second electrical power on the basis of the monitoring of the at least one communication line.

2. The method according to claim 1, a frame comprising useful data and one or more checksums for the useful data being transmitted between the first device and the second device via the data connection, the useful data being checked for an error by checking the checksum, a discontinuation in the data connection being detected if the checking has revealed that the useful data have an error or have exceeded a predetermined number of errors or a predetermined number of errors inside the frame.

3. The method according to claim 1, wherein the data connection comprises a communication connection according to an EtherCAT standard.

4. The method according to claim 1,
the first connector part comprising at least four first contacts being configured for coupling a four-core communication line to the first device, the at least two second contacts being configured for coupling a two-core electrical line to the first device, and
the second connector part comprising at least four first mating contacts assigned to the at least four first contacts of the first connector part, four first mating contacts being configured for coupling a four-core communication line to the second device, the at least two second mating contacts which are assigned to the at least two second contacts of the first connector part, the two second contacts being configured for coupling a two-core electrical line to the second device.

5. A bus system comprising a first device, a second device and an electrical plug connector for electrically connecting the first device to the second device, the electrical plug connector comprising a first connector part and a second connector part, the first connector part comprising at least four first contacts being configured for coupling a four-core communication line to the first device,
at least two second contacts being configured for coupling a two-core four electrical line to the first device, and
a protective conductor contact;
the second connector part comprising at least four first mating contacts assigned to the at least four first contacts of the first connector part, the at least four first mating contacts being configured for coupling a further four-core communication line to the second device,
at least two second mating contacts which are assigned to the at least two second contacts of the first connector part, the at least two second contacts being configured for coupling a further two-core electrical line to the second device, and
a protective conductor mating contact which is assigned to the protective conductor contact of the first connector part;
the electrical plug connector being configured as a multistage plug connector having a first stage, a second stage and a third stage, the first stage comprising the first contacts and the first mating contacts, the second stage comprising the second contacts and the second mating contacts, the third stage comprising the protective conductor contact and the protective conductor mating contact wherein the first stage, the second stage and the third stage are configured for successively disconnecting from one another during an unplugging operation and for successively coupling during a plugging-in operation with the result that, during the unplugging operation, the first contacts are first disconnected from the first mating contacts, the second contacts are then disconnected from the second mating contacts, and finally the protective conductor contact is disconnected from the protective conductor mating contact, the first stage being configured for providing a first electrical power for the second device by the first device and a data connection via the four-core communication lines, wherein two supply voltages are applied to the four-core communication lines, one supply voltage for each respective pair of cores, the second stage being configured for providing a second electrical power for the second device by the first device via the electrical line; and
the first device comprising a monitoring device for monitoring the communication line to the first device, the monitoring device being configured to monitor the unplugging operation of the first stage by determining a discontinuation in the data connection, the occurrence of the discontinuation in the data connection indicating an automatic termination of the provision of the first electrical power, and a switching-off device for terminating the provision of the second electrical power for the second device by the first device via the electrical lines on the basis of the monitoring of the communication line to the first device.

6. The bus system according to claim 5, the monitoring device being configured to check a useful data for an error by checking one or more checksums for useful data in a frame which is transmitted between the first device and the second device via the data connection and comprises the checksums, with the result that a discontinuation in the data connection is detected if the checking has revealed that the useful data have an error or have exceeded a predetermined number of errors or a predetermined number of errors within the frame.

7. The bus system according to claim 5, the first connector part comprising the at least four first contacts being configured for coupling the four-core communication line to the first device, the at least two second contacts being configured for coupling the further two-core electrical line to the first device, and the second connector part comprising the at least four first mating contacts assigned to the at least four first contacts of the first connector part, the at least four first mating contacts being configured for coupling the four-core communication line to the second device, the at least two second mating contacts which are assigned to the at least two second contacts of the first connector part, the at least two second contacts being configured for coupling the further two-core electrical line to the second device.

8. A method for detecting decoupling of a first connector part, connected to a first device, of an electrical plug connector from a second connector part, connected to a second device, of the electrical plug connector, the first connector part comprising at least two first contacts being configured for coupling a communication line to the first device, at least two second contacts being configured for coupling an electrical line to the first device, and a protective conductor contact;

the second connector part comprising at least two first mating contacts assigned to the at least two first contacts of the first connector part, the two first mating contacts being configured for coupling a further communication line to the second device, at least two second mating contacts which are assigned to the at least two second contacts of the first connector part, the two second contacts being configured for coupling a further electrical line to the second device, and a protective conductor mating contact which is assigned to the protective conductor contact of the first connector part, the plug connector being configured as a multistage plug connector having a first stage, a second stage and a third stage, the first stage comprising the first contacts and the first mating contacts, the second stage comprising the second contacts and the second mating contacts, the third stage comprising the protective conductor contact and the protective conductor mating contact, wherein the first stage, the second stage and the third stage are configured for successively disconnecting from one another during an unplugging operation and for successively coupling during a plugging-in operation with the result that, during the unplugging operation, the first contacts are first disconnected from the first mating contacts, the second contacts are then disconnected from the second mating contacts, and finally the protective conductor contact is disconnected from the protective conductor mating contact, the method comprising the following steps of:

providing a first electrical power for the second device by the first device and a data connection between the first device and the second device via the communication lines during the plugging-in operation of the first stage, providing a second electrical power for the second device by the first device via the electrical lines during the plugging-in operation of the second stage, monitoring at least one communication line for the unplugging operation of the first stage the monitoring comprising determining of a change in the provision of the first electrical power by monitoring a drop of an electrical supply current corresponding to the first electrical power provided, the monitoring of the drop of the electrical supply current taking a latency of an electronic component, which is connected in an electrical circuit comprising the communication line, into account, and terminating the provision of the second electrical power on the basis of the monitored drop of the electrical supply current.

9. The method according to claim 8, the drop of the electrical supply current being compared with a predefined threshold value, the provision of the second electrical power being terminated on the basis of the comparison.

10. The method according to claim 9, the provision of the first electrical power comprising application of an electrical supply voltage of 24 V to the communication line, with the result that a supply current of at least 60 mA can flow, the predefined threshold value being 30 mA.

11. The method according to claim 9, the first connector part comprising at least four first contacts being configured for coupling a four-core communication line to the first device, the at least two second contacts being configured for coupling a two-core electrical line to the first device, and the second connector part comprising at least four first mating contacts assigned to the at least four first contacts of the first connector part, four first mating contacts being configured for coupling a four-core communication line to the second device, the at least two second mating contacts which are assigned to the at least two second contacts of the first connector part, the two second contacts being configured for coupling a two-core electrical line to the second device.

* * * * *

UNITED STATES PATENT AND TRADEMARK OFFICE
CERTIFICATE OF CORRECTION

PATENT NO. : 10,790,622 B2
APPLICATION NO. : 15/473203
DATED : September 29, 2020
INVENTOR(S) : Pohl et al.

It is certified that error appears in the above-identified patent and that said Letters Patent is hereby corrected as shown below:

In the Claims

At Column 18, Line 8 (Claim 5, Line 10):
"a two-core four electrical line" should be --a two-core electrical line--

At Column 18, Line 48 (Claim 5, Line 50):
"device via the electrical line" should be --device via the electrical lines--

Signed and Sealed this
Nineteenth Day of January, 2021

Andrei Iancu
*Director of the United States Patent and Trademark Office*